(12) United States Patent
Matsumoto et al.

(10) Patent No.: US 7,400,470 B2
(45) Date of Patent: Jul. 15, 2008

(54) HEAD GIMBAL ASSEMBLY AND MAGNETIC DISK DRIVE WITH SPECIFIC SOLDER BALL OR SLIDER PAD AND ELECTRODE STUD DIMENSIONING TO PRODUCE RELIABLE SOLDER BALL CONNECTION USING LASER ENERGY

(75) Inventors: Yuhsuke Matsumoto, Kanagawa (JP);
Tatsushi Yoshida, Kanagawa (JP);
Takaaki Murokawa, Kanagawa (JP);
Tatsumi Tsuchiya, Kanagawa (JP);
Yoshio Uematsu, Kanagawa (JP);
Nobuyuki Hashi, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 468 days.

(21) Appl. No.: 11/112,719

(22) Filed: Apr. 21, 2005

(65) Prior Publication Data
US 2006/0238921 A1    Oct. 26, 2006

(51) Int. Cl.
*G11B 5/60*    (2006.01)
(52) U.S. Cl. .................................................. 360/234.5
(58) Field of Classification Search .............. 360/234.5, 360/245.8, 245.9
See application file for complete search history.

(56) References Cited

U.S. PATENT DOCUMENTS

| 6,330,132 | B1 | 12/2001 | Honda | |
|---|---|---|---|---|
| 6,657,134 | B2 * | 12/2003 | Spielberger et al. | 174/260 |
| 6,821,814 | B2 * | 11/2004 | LaFontaine et al. | 438/108 |
| 7,122,897 | B2 * | 10/2006 | Aiba et al. | 257/738 |
| 2002/0000651 | A1 * | 1/2002 | Takizawa et al. | 257/697 |

FOREIGN PATENT DOCUMENTS

JP    10-079105    3/1998

* cited by examiner

*Primary Examiner*—A. J. Heinz
(74) *Attorney, Agent, or Firm*—Townsend and Townsend and Crew LLP (57) ABSTRACT

Embodiments of the invention provide a head gimbal assembly (HGA) capable of effecting solder ball connection with use of low energy. In one embodiment, the HGA includes a head/slider. In the head/slider, slider pads and lead wire pads are connected to each other by reflow of solder balls under the radiation of a laser beam. Lead layers are connected to a magnetic head and electrode studs are connected to the lead layers, respectively, and are also connected to the slider pads. The diameter R (m) of a solder ball and a sectional area S ($m^2$) of an electrode stud are in a relation of $R^2 \geqq 4S$.

18 Claims, 11 Drawing Sheets

Fig. 11

HEAD GIMBAL ASSEMBLY AND MAGNETIC DISK DRIVE WITH SPECIFIC SOLDER BALL OR SLIDER PAD AND ELECTRODE STUD DIMENSIONING TO PRODUCE RELIABLE SOLDER BALL CONNECTION USING LASER ENERGY

BACKGROUND OF THE INVENTION

The present invention relates to a head/slider structure adapted to connect slider pads and lead pads through solder balls and more particularly to a head/slider structure suitable for solder ball connection with high-quality by radiation of weaker laser energy.

Recently, magnetic disk drives have come to be used in many electronic devices and the necessity of improving yield in mass production is becoming more and more important. A head gimbal assembly (hereinafter referred to as "HGA") which supports a slider formed with a magnetic head for data read and write is incorporated in a magnetic disk drive. The HGA comprises a head/slider including a magnetic head and a slider, a flexure constructed so as to permit the head/slider to perform a track follow-up motion while flying over the magnetic head and performing pivotal motions, a load beam which applies a pushing load to the flexure, a mounting plate adaptable to fix the load beam to an actuator assembly, and a lead wire for electric connection between the magnetic head and a circuit board. The construction of the HGA exclusive of the head/slider is designated a suspension assembly.

A slider pad which functions as a relay terminal for connecting the magnetic head to a lead pad formed at an end of the lead wire is formed on an outer side face of the slider. After fabrication of the suspension assembly, the head/slider is fixed to a flexure tongue of the flexure with use of an adhesive. Therefore, it is necessary that the lead pad and the slider pad be connected together electrically after the head/slider is fixed to the flexure tongue.

Figure 10:
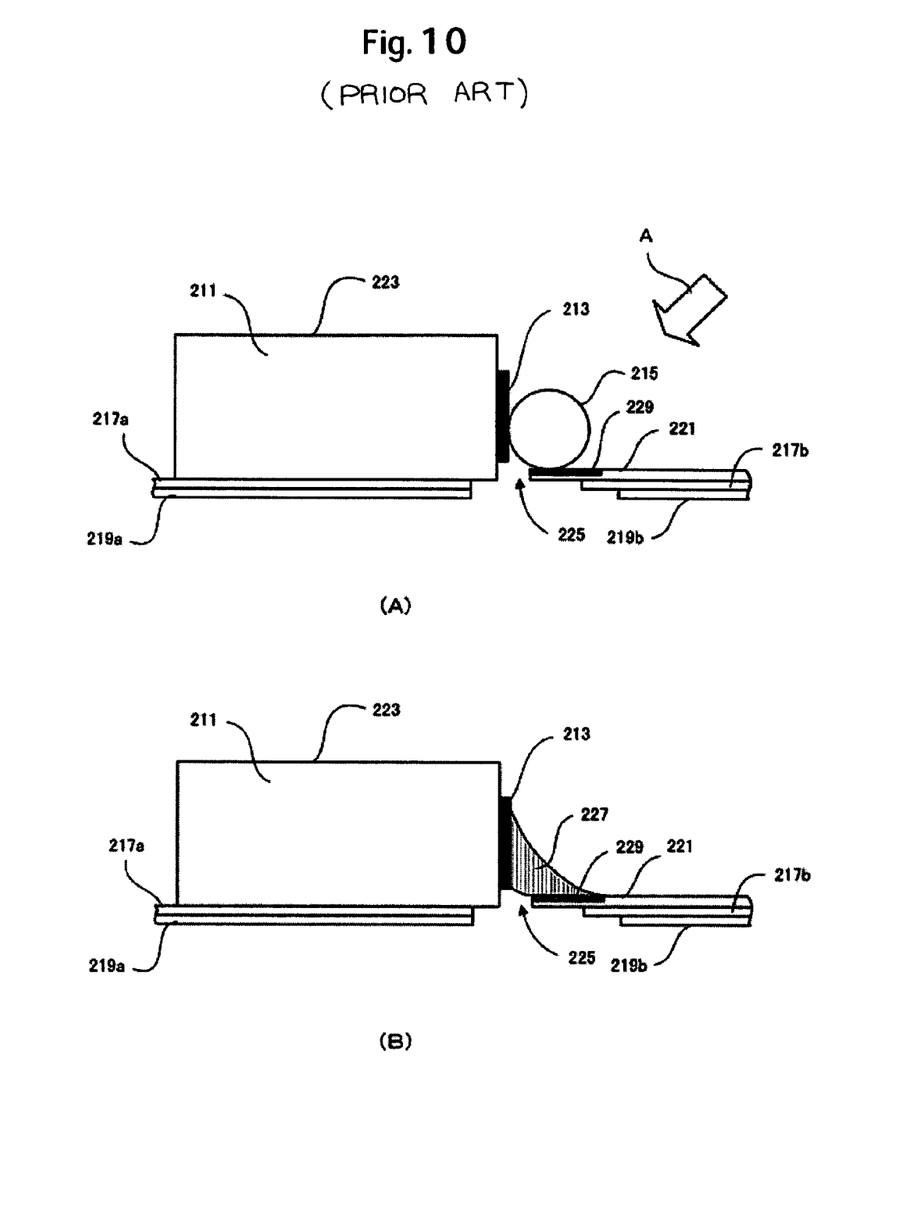
FIG. 10 is a diagram explaining a conventional solder ball connecting method for connecting a slider pad and a lead pad in the head/slider.

Soldered surfaces of the lead pad and the slider pad are disposed in a positional relation such that planes including the soldered surfaces intersect perpendicularly to each other (a virtual right angle is formed at an intersecting point when the soldered surfaces of both pads are viewed sideways). FIG. 10 is a diagram illustrating a state where a lead pad and a slider pad are connected together by a solder ball connecting method. In FIG. 10(A) there are shown metallic layers 219a and 219b which constitute a support structure of a flexure, dielectric layers 217a and 217b of polyimide laminated onto the metallic layers 219a and 219b, and a lead wire 221 formed by laminating a copper layer onto the dielectric layer 217b. A head/slider 211 is mounted on the dielectric layer 217a in such a manner that an air bearing surface (hereinafter, referred to as "ABS") 223 thereof opposed to a magnetic disk faces upward. A magnetic head is embedded into the head/slider 211 so that it can be magnetically coupled with the magnetic disk opposed to the ABS 223. Further, a slider pad 213 for connection between the magnetic head and the lead wire 221 is formed on an end side face of the head/slider 211.

The metallic layer 219a which supports the head/slider 211 is called a flexure tongue and, when the head/slider 211 flies over the surface of the magnetic disk, the metallic layer 219a performs gimbal motions or pivot motions about a dimple which is formed as fulcrum on a load beam (not shown). The lead wire 221 extends toward the front face of the slider pad 213 up to a position such that there remains a space 225 between the position and the head/slider 211. The lead wire 221 is formed with a lead pad 229 at its distal end.

According to the solder ball connecting method, first a spherical solder ball 215 is temporarily fixed so as to come into contact with both the slider pad 213 and lead pad 229 and a laser beam is radiated to the solder ball 215 in the direction of arrow A to melt the solder ball 215. Thereafter, the radiation of the laser beam is stopped, followed by cooling, to form a solder fillet 227 shown in FIG. 10(B) for electric connection between the pads. In the solder ball connecting method, at the time of reflowing the solder ball 215 with use of laser energy, there sometimes occurs a connection defect such as molten solder being attracted strongly to one pad, resulting in the solder fillet 227 being not connected to the other pad, or the area of connection between the solder fillet 227 and the pads being insufficient, or the strength of connection being insufficient, or the occurrence of short-circuit with an adjacent pad. The solder ball reflowing process using a laser beam includes a process of performing both heating and cooling in an extremely short time as is described in Japanese Patent Laid-open No. 10-79105.

BRIEF SUMMARY OF THE INVENTION

Recently, as one means for environmental conservation, lead-free solder has come to be used as the material of a solder ball. The lead-free solder is high in melting point. For example, the melting point of lead-free solder comprising Sn(85-95 wt %)/Ag(1-3 wt %)/Bi(1-5 wt %)/Cu(1 wt % or less) is as high as 210° C. to 216° C. in comparison with the melting point (184° C.) of commonly-used tin-lead eutectic solder. Therefore, when a solder ball formed of lead-free solder is adopted in the solder ball connecting method, it is necessary that the radiation energy of a laser beam be made stronger than in the case of using tin-lead eutectic solder to increase the temperature of the solder ball above the melting point.

However, if the laser beam radiation energy is made strong, the polyimide layer present around the solder ball-connected slider pad and lead pad and the material of the magnetic head in the interior of the slider are liable to be damaged with heat. Thus, an upper-limit value is encountered in the magnitude of the radiation energy. If the radiation energy to the solder ball is weakened, a connection defect may occur in the solder fillet formed after cooling even if the solder ball is melted and thus a lower-limit value is also encountered in the magnitude of the radiation energy.

Therefore, it is preferable that the solder ball connection be effected using radiation energy which is as weak as possible within the range of not causing a connection defect of the solder fillet. Methods for weakening the radiation energy includes a method for improving the material of solder, and a method wherein the structure of the head/slider is modified so that the radiated laser energy can be utilized effectively for increasing the temperature of the solder ball.

Accordingly, it is a feature of the present invention to provide an HGA having a head/slider suitable for solder ball connection of good quality with use of a lowered magnitude of laser energy. It is another feature of the present invention to provide an HGA having a head/slider suitable for solder ball connection with use of a solder ball formed of lead-free solder. It is a further feature of the present invention to provide a magnetic disk drive which adopts such a head gimbal assembly.

According to embodiments of the present invention, at the time of connecting a slider pad of a head/slider and a lead pad by the solder ball connecting method, the solder connection can be effected by the radiation of lower laser energy and provide a higher non-defect rate or yield. The solder ball connecting method indicates a method involving radiating laser energy to a spherical solder, causing reflow and thereby allowing a solder fillet to be formed to connect a slider pad and a lead pad. It is different from the method wherein heat is applied to a spherical solder with use of soldering iron to melt the solder for connection. It is also different from such a method as disclosed in U.S. Pat. No. 6,330,132 (Japanese Patent Laid-open No. 2000-251217) wherein ultrasonic oscillation is applied to a ball-like bonding member formed of gold to effect connection.

In the solder ball connecting method, in order to form a solder fillet of good quality, it is necessary that laser energy be radiated to a solder ball for a short time to melt the solder ball and the thus-melted solder be allowed to spread appropriately over connection surfaces of the slider pad and the lead pad. When the solder which has been in spot contact with the slider pad in the state of a solder ball is melted and spreads over the surface of the slider pad, heat begins to be released from the slider pad and further through an electric current path formed in the interior of the slider. If the amount of the heat thus released is very large, the solder may be solidified before fully spreading over the connection surface of the slider pad or a satisfactory electric connection may not be attained between the solder and the connection surface.

The diameter R of the solder ball defines the volume of solder, which in turn defines the quantity of heat which molten solder possesses. Therefore, when the quantity of heat escaping to the electric current path through the slider pad is considered constant, the smaller the solder ball diameter, the more conspicuous the decrease in temperature of molten solder and the higher the defect rate in solder connection. Since the larger the sectional area of the electric current path, the larger the amount of heat released via the slider pad, it is necessary, in order to keep a low defect rate in solder connection, that the smaller the solder ball diameter, the smaller should be the sectional area of the electric current path. The head gimbal assembly according to an embodiment of the present invention is constructed so that the solder ball diameter R (m) and a sectional area S (m$^2$) of a connecting portion of the electric current path for connection to the slider pad, the electric current path providing connection between the slider pad and a magnetic head, satisfies the relation of $R^2 \geq 4S$.

Moreover, the weaker the laser energy, the more conspicuous the decrease in temperature of solder, so by satisfying the above relation between the solder ball diameter R and the sectional area S of the connection of the electric current path to the slider pad, it is possible to effect solder connection of good quality with use of weak laser energy.

Further, the solder ball diameter is selected so as to be approximately equal to or a slightly smaller than the area A of the soldered surface of the slider pad. Therefore, it is possible to effect solder connection of good quality by satisfying the relation of $A \geq 4S$ between the area A (m$^2$) of the soldered surface of the slider pad and the sectional area S (m$^2$) of the connecting portion of the electric current path for connection to the slider pad.

DETAILED DESCRIPTION OF THE INVENTION

Figure 1:
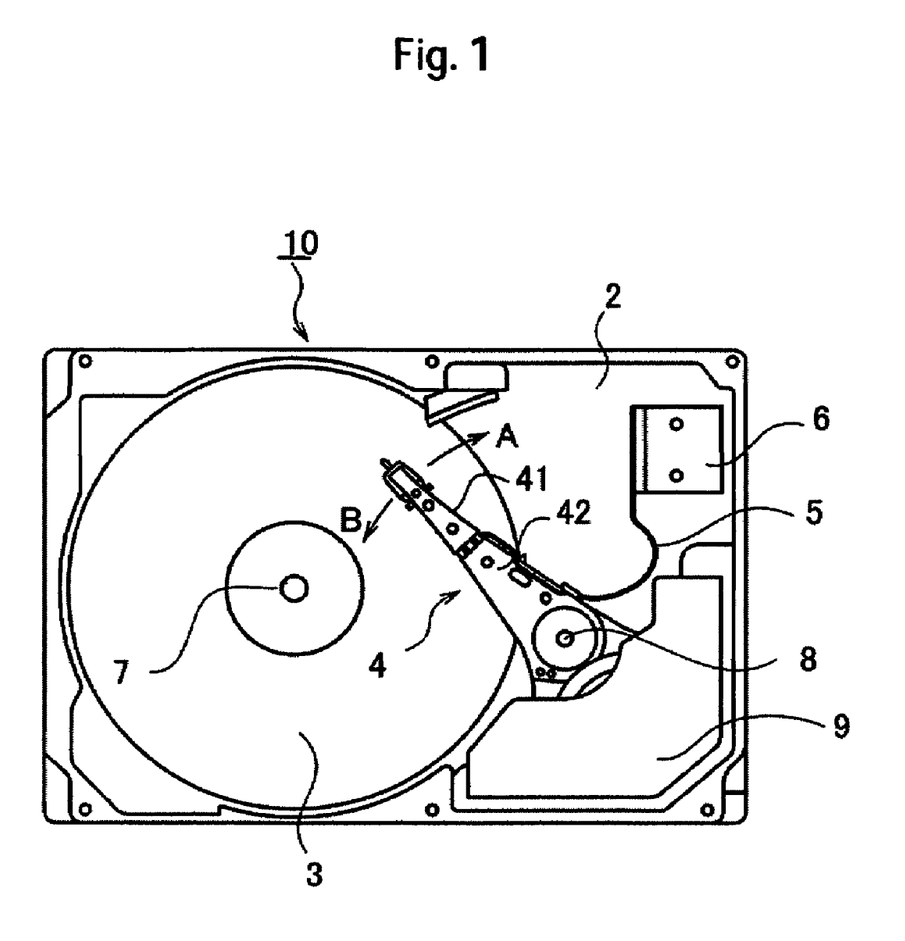
FIG. 1 is a plan view showing the construction of a magnetic disk drive.
Figure 2:
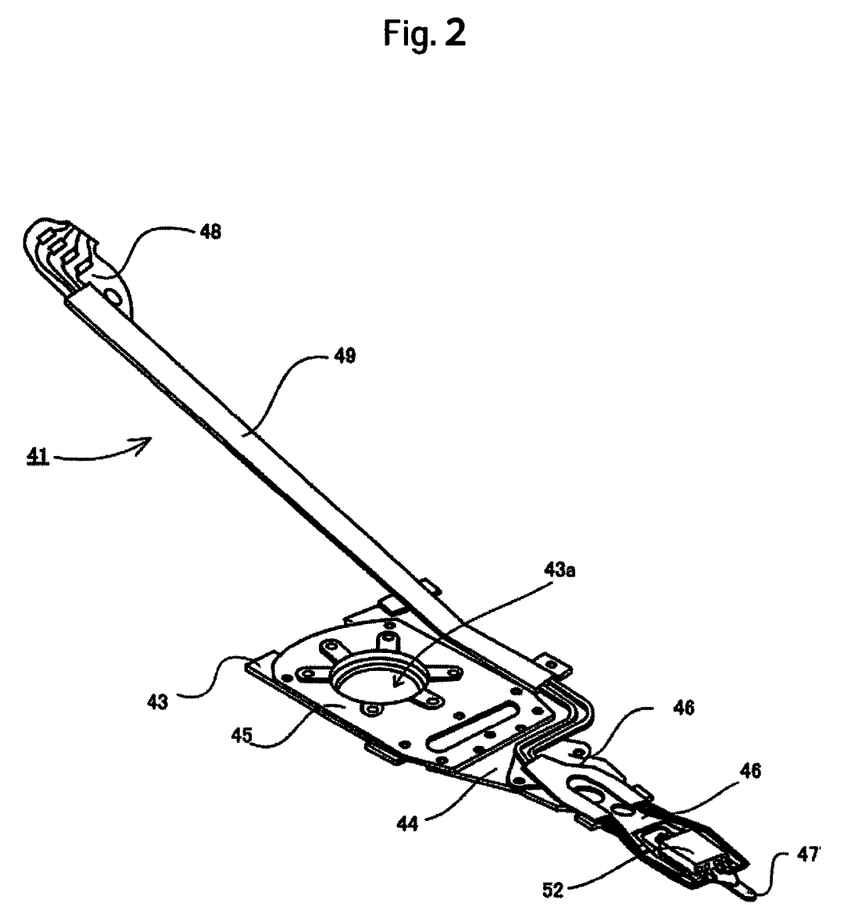
FIG. 2 is a perspective view showing the entire construction of a head gimbal assembly.
Figure 3:
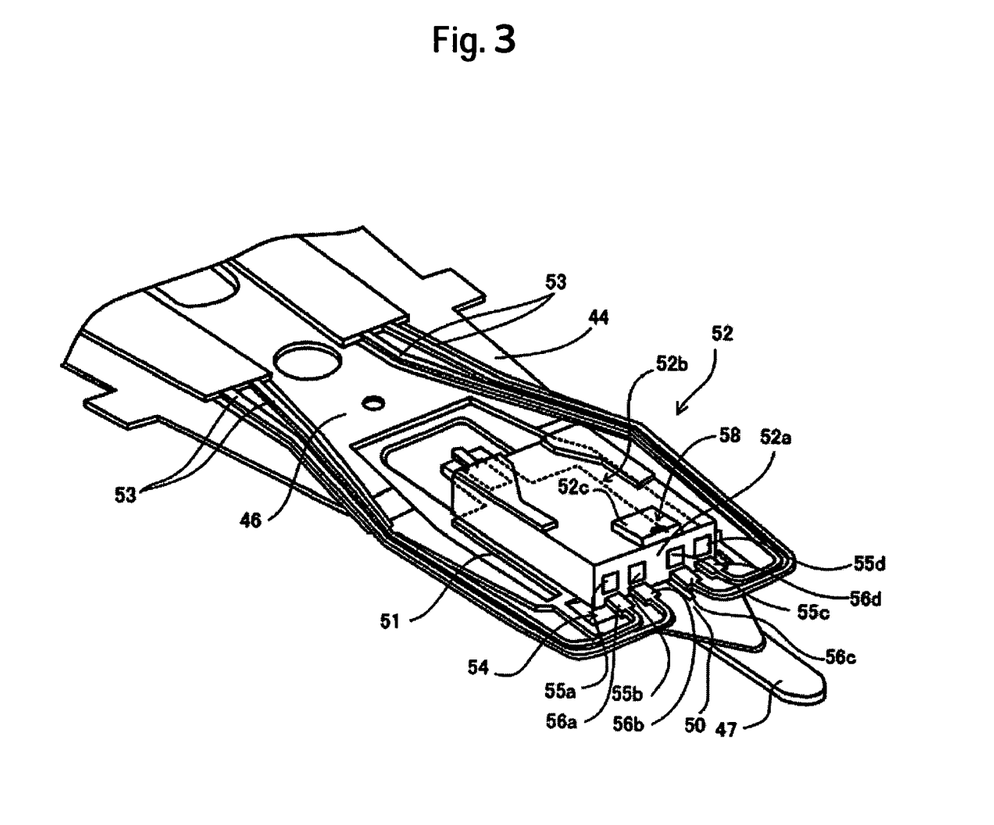
FIG. 3 is a partially enlarged perspective view of a head/slider portion in the head gimbal assembly.

A head/slider, an HGA and a magnetic disk drive according to specific embodiments of the present invention will be described below with reference to the drawings. FIG. 1 is a plan view showing the construction of a magnetic disk drive, FIG. 2 is a perspective view showing an entire construction of an HGA, and FIG. 3 is a partial enlarged view of a head/slider portion of the HGA shown in FIG. 2. Throughout the whole of the drawings in the present application, the same constituent elements are identified by the same reference numerals.

As shown in FIG. 1, a magnetic disk drive 10 is provided on a base 2 with a magnetic disk 3, a head stack assembly 4, a flexible cable 5, and a terminal 6 for connecting the flexible cable 5 to an external circuit board. The magnetic disk 3 is screwed to a rotor portion of a spindle motor (not shown) which is disposed in the base 2 and is constructed so as to rotate about a spindle shaft 7.

The head stack assembly 4 is composed of an HGA 41 and an actuator assembly 42. As shown, for example, in FIG. 2, the HGA 41 is constructed as a wiring-integrated type suspension and a principal portion thereof is made up of a head/slider 52, a base plate 43, a load beam 44, a hinge 45, and a flexure 46. The base plate 43 is formed with an aperture 43a. By utilizing the aperture 43a, a mounting plate fixed to the back side of the base plate 43 is subjected to swaging to fix the HGA 41 to the actuator assembly 42. The structure which remains after removing the head/slider from the HGA 41 is designated a suspension assembly.

As wiring integrated type suspensions there are known a subtractive type and an FPC type in addition to an additive type according to this embodiment depending on the difference in their fabrication methods. However, the present invention is applicable to any type of the suspension assembly. The additive type is a method wherein copper foil wiring and pads are additionally formed onto an insulator of a suspension. The subtractive type is a method wherein wiring and pads are formed by etching copper foil which is formed like sheet on an insulator of a suspension. The FPC type is a method wherein a flexible substrate (FPC) formed with copper foil wiring and pads is bonded to a suspension.

The actuator assembly 42 is made up of an actuator arm (not shown) which supports the HGA 41, a fixing portion for a pivot assembly which constitutes a pivot shaft 8, and a coil support (not shown) which holds a voice coil (not shown). The actuator assembly 42 pivotally moves the HGA 41 in the direction of arrow A or B about the pivot shaft 8. The voice coil and a yoke 9, together with a voice coil magnet (not shown), constitutes a voice coil motor (hereinafter referred to as "VCM").

The hinge 45, which has elasticity, connects the base plate 43 with the load beam 44 and imparts a pushing load to the load beam 44 so that the head/slider can fly over the magnetic disk properly. A lift tab 47 is formed at a front end of the HGA 41 in order to implement a load/unload system together with a ramp. A lead wire 49 extends in a crank shape from the front end of the HGA 41 to a connector portion 48. The flexure 46 holds the lead wire 49 on the front end side thereof and is spot-welded to the load beam 44 and the base plate 44 by means of a laser. The lead wire 49 includes four conductors connected to a magnetic head formed in the head/slider 52. The number of such conductors varies depending on the construction of the magnetic head.

The flexure 46 is fixed to the load beam 44 so that a flexure tongue 51 with the head/slider 52 fixed thereto can perform pivot motions or gimbal motions. As shown in FIG. 3, the flexure tongue 51 is formed so as to project from a platform 50 located at a foremost end of the flexure 46 toward the center of the aperture and a fixing surface of the head/slider 52 is fixed, with the ABS 52b up, to the flexure tongue 51 with an adhesive.

A dimple (not shown) projects from the load beam 44 and it supports the flexure tongue 51 at a position corresponding to the central part of the slider 52. According to this structure, when the head/slider 52 flies under the action of an air flow created on the surface of the magnetic disk, it performs soft pivot motions in both pitch and roll directions relative to the load beam 44 and thus can perform a track follow-up motion.

An aperture 54 is formed in the portion where slider pads 55a, 55b, 55c, 55d are solder-connect to lead pads 56a, 56a, 56c, 56d, respectively, that is, between the platform 50 and the flexure tongue 51. As shown in FIG. 3, at or near a position where the lead wire 49 outgoes from a protective sheet the lead wire 49 shown in FIG. 2 is divided into two pairs of lead wires 53. The lead wires 53 extend toward the front end of the HGA 41, then at a side face of the aperture 54 formed in the front end portion of the flexure 46 the lead wires 53 bend at approximately right angles in a floating state in the air and reach the platform 50. Further, on the platform 50, each of the lead wires 53 again bends approximately perpendicularly toward the corresponding one of the slider pads 55a, 55b, 55c and 55d formed on a side face 52a of the head/slider 52 which side face is located on an air flow outlet end side, i.e., on a trailing edge side.

The four slider pads 55a, 55b, 55c and 55d are appropriately connected to a write head and a read head both formed in the interior of the head/slider 52. The number of slider pads is not limited to four. Recently there also has been developed a head/slider of the type wherein a flying height which varies due to thermal protrusion generated in a write head is adjusted with a heater formed in the head/slider. In this case, a total of six slider pads are formed which include slider pads connected to the heater in addition to slider pads connected to write and read heads. Further, since the spacing between each slider pad becomes narrower, it is necessary that lead pads and slider pads be soldered together with a high degree of accuracy while ensuring good quality even with use of low laser energy. In this point the head/slider structure of this embodiment is effective.

At ends of the bent lead wires 53 the lead pads 56a, 56b, 56c and 56d are formed to connect with the slider pads 55a, 55b, 55c and 55d, respectively, formed on the side face 52a on the trailing edge side of the head/slider 52. The slider pads 55a, 55b, 55c and 55d are formed by plating a seed layer with gold, the seed layer being formed of, for example, nickel or chromium on the surface of the slider 52. A plane extending from the surface or soldering surface of each slider pad and a plane extending from the surface or a soldering surface of each lead pad intersect each other at right angles. In the present invention, however, it is not necessary to make limitation to the case where planes extending from the surfaces of the slider pads 55a, 55b, 55c, 55d and the lead pads 56a, 56b, 56c, 56d intersect each other at right angles. The present invention is also applicable to the case where the planes intersect each other at another angle selected suitably for the solder ball connection.

The following description is now provided of the method of connecting the slider pads 55a, 55b, 55c, 55d and the lead pads 56a, 56b, 56c, 56d, respectively, by the solder ball connecting method. First, the HSA 41 is supported by a jig so that the right angle defined by the plane extending from the surface of each slider pad and the plane extending from the surface of each lead pad faces vertically upward. Then solder balls are placed temporarily between both pads, and thereafter a laser beam is applied to each solder ball to form a solder fillet which bridges between both pads, thus connecting both the pads.

Figure 4:
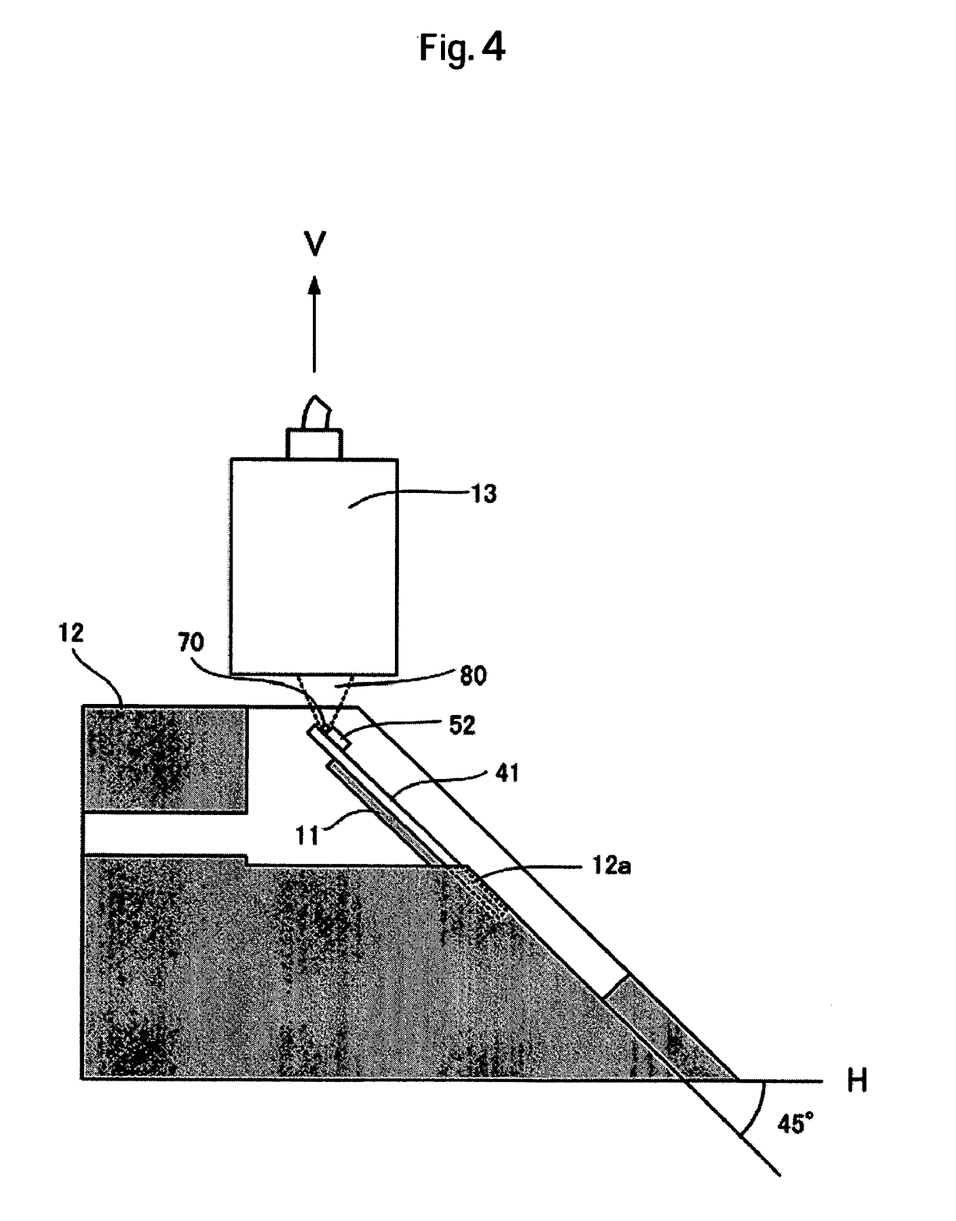
FIG. 4 is a diagram showing a solder ball bonding apparatus wherein a laser beam is applied to a solder ball disposed between both pads to connect both pads according to an embodiment of the present invention.
Figure 5:
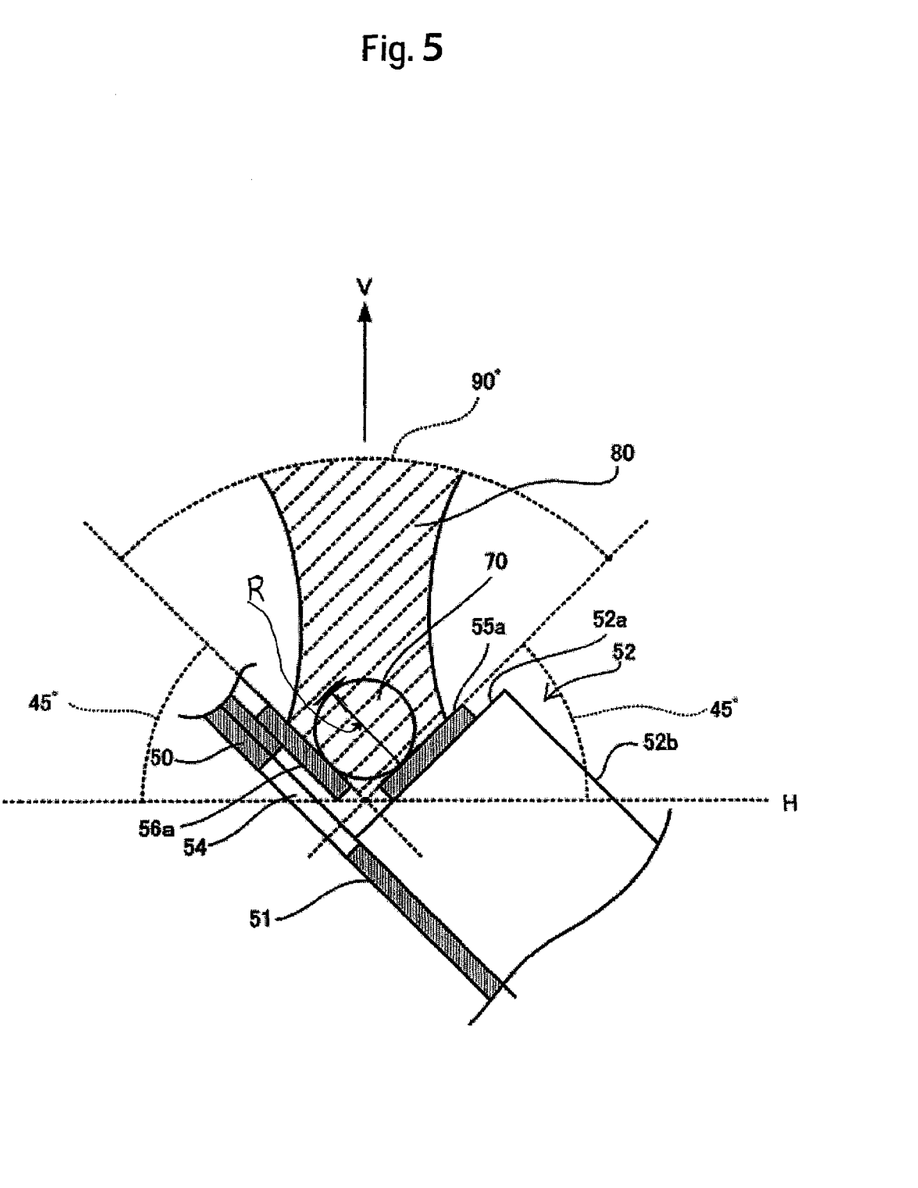
FIG. 5 is a diagram showing on a larger scale a state in which a solder ball is placed on the head gimbal assembly held by a working jig according to an embodiment of the present invention.

A description will now be given of a method for supporting the HGA 41 so that the right-angled portion defined by the surface of each slider pad and the surface of each lead pad faces upward. FIG. 4 is a sectional view of a solder ball bonding apparatus which applies a laser beam to a solder ball 70 disposed between both pads to connect the pads. FIG. 5 is a sectional view showing on a larger scale a state in which the solder ball 70 is placed temporarily on the HGA 41 held by a working jig 11 shown in FIG. 4. An optical (laser) device 13 for applying a laser beam 80 to the solder ball 70, the working jig 11 which holds the HGA 41, and a table 12 which holds the working jig 11, are shown in FIG. 4.

The table 12 has a mount surface 12a having an inclination of 45° relative to a horizontal plane H, and the working jig 11 is placed on the slant surface 12a so as to also have an inclination of 45° relative to the horizontal plane H. Further, the HGA 41 is held on the working jig 11 in a state where the head/slider 52 assumes an upper position and its ABS faces upward. At this time, in the HGA 41 held by the working jig 11, the surfaces of the slider pads 55a, 55b, 55c, 55d on the front end portion of the HGA 41 and the surfaces of the lead pads 56a, 56b, 56c, 56d opposed thereto respectively are maintained at an angle of approximately 45° relative to the horizontal plane. Thus, the HGA 41 is supported in such a manner that the V structure of a virtual right-angled portion formed by the surfaces of the slider pads 55a, 55b, 55c, 55d and the surfaces of the lead pads 56a, 56b, 56c, 56d is open vertically upward.

Then, the solder ball 70 is temporarily placed between each of the slider pads and each of the lead pads and thereafter the laser beam 80 is directed to the solder ball 70. The method of disposing the solder ball 70 between both pads and applying the laser beam 80 to the solder ball is described in detail in Japanese Patent Laid-open Nos. 2002-25025 and 2002-251705, the disclosures of which are incorporated herein by reference. The method for disposing the solder ball 70 and the construction of the optical device 13 are simply explained because they are not directly related to the present invention.

The optical device 13 is a terminal module of a fiber laser which utilizes an optical fiber as a resonator. It has a series of optical lenses arranged on an internal optical path to form a hollow space as a laser beam path. The optical lenses converge divergent rays outputted from an optical fiber into the laser beam 80, and the convergent rays are outputted from a front end of the optical device 13.

The slider pads 55a, 55b, 55c, 55d and the lead pads 56a, 56b, 56c, 56d are arranged so as to rise at an angle of 45° from the horizontal plane. The planes extending from the surfaces of the slider pads 55a, 55b, 55c, 55d and from the surfaces of the lead pads 56a, 56b, 56c, 56d intersect each other, with a virtual right angle being formed between both pads. Since the virtual angle is open vertically upward, the solder ball 70 which is dropped from a solder ball transfer device can be received.

When the solder ball 70 is placed so as to contact the connecting surfaces of the associated slider pad and lead pad and becomes standstill, the optical device 13 is moved to an irradiating position by a moving mechanism (not shown) and emits a converged laser beam 80 with a predetermined spot diameter to the solder ball 70. At a timing during the period from the temporary placing of the solder ball 70 to the emission of the laser beam 80, a predetermined amount of nitrogen gas ($N_2$) which creates an inert atmosphere for suppressing the oxidation of solder is injected through a nitrogen gas introducing pipe installed in the table 12. Thus, the slider pads 55a, 55b, 55c, 55d, the lead pads 56a, 56b, 56c, 56d and solder balls 70 are placed in an inert atmosphere.

While the inert atmosphere is maintained, the optical device 13 directs the laser beam 80 to the solder balls 70 to melt them, thereby connecting the slider pads 55a, 55b, 55c, 55d with the lead pads 56a, 56b, 56c, 56d, respectively. For example, in a case of the outside diameter of each solder ball 70 being about 120 μm, the spot diameter of the laser beam 80 is set at a value of about 150 to 200 μm, so that a portion of the laser beam is directed to a place other than the solder ball. A solder ball 70 having an outside diameter of about 130 μm or less can be used. For example a solder ball 70 having an outside diameter of about 80 μm, 110 μm, or 130 μm is used.

Figure 6:
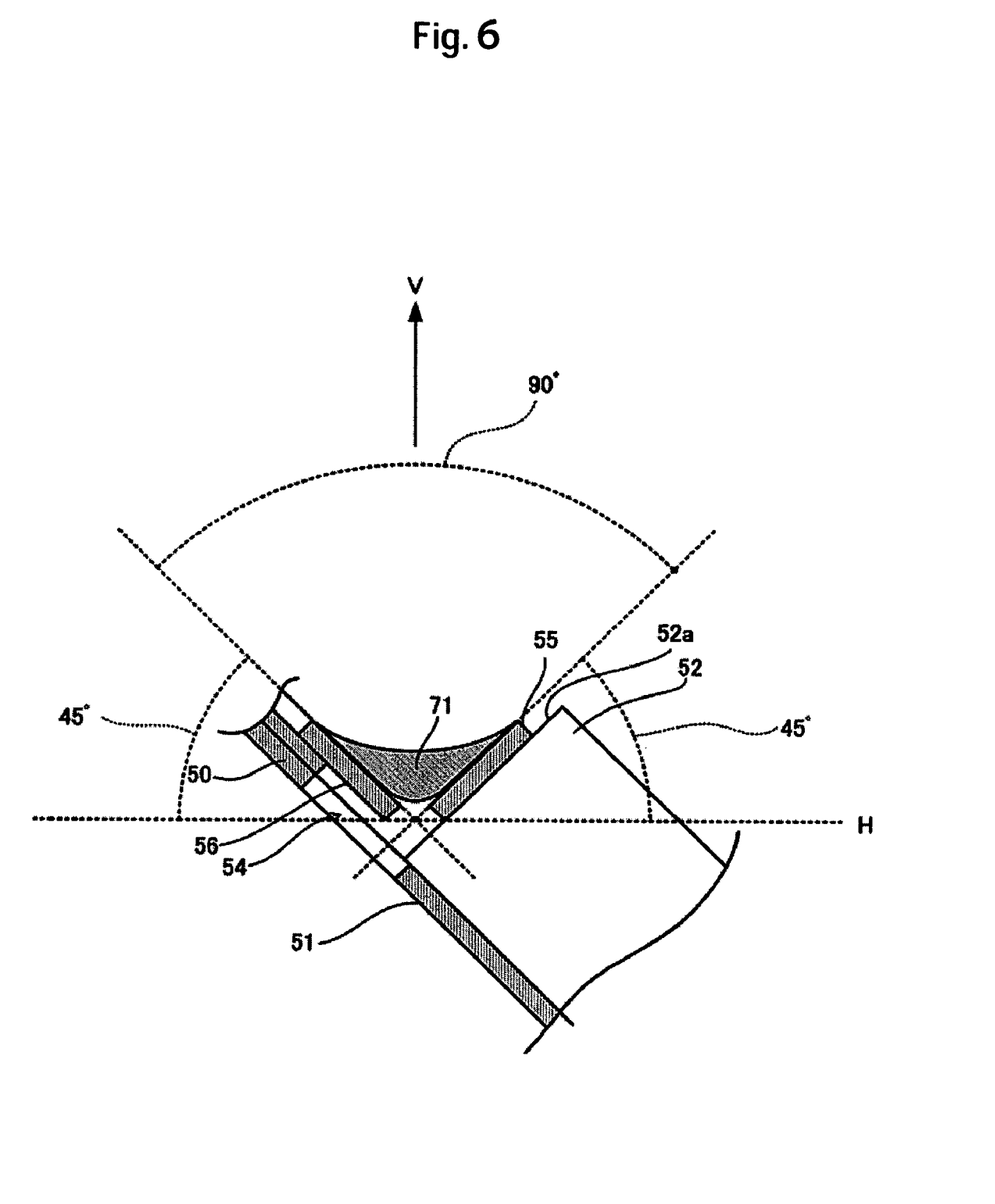
FIG. 6 is a diagram showing on a larger scale a state in which a solder fillet is formed by melting of the solder ball and a slider pad and a lead pad are thereby connected together according to an embodiment of the present invention.

Thus, by melting solder in an inert atmosphere of nitrogen gas ($N_2$), both pads are bonded together, followed by cooling to form a solder fillet. At this time, the inert nitrogen gas ($N_2$) covers the surface of the solder, whereby the oxidation of the solder can be prevented. FIG. 6 is a sectional view showing on a larger scale a mutually connected state of both slider pad 55 and lead pad 56 by melting of the solder ball shown in FIG. 5.

The molten solder ball 70 spreads throughout the whole surfaces of both the slider pad 55 and lead pad 6. When the radiation of the laser beam is subsequently stopped, the solder is cooled and solidifies to form a solder fillet 71 which connects both pads in an inverted arch shape. When the solder melted by the radiation of the laser beam comes into contact with the soldering surface of the slider pad and spreads over the same surface, if the drop of the solder temperature is excessive, the molten solder may fail to spread throughout the whole surface of the slider pad, or the solder quantity may be biased to the lead pad side, or a connection defect between the soldering surface and the solder fillet may occur, thus making it impossible to form a solder fillet of good quality.

Figure 7:
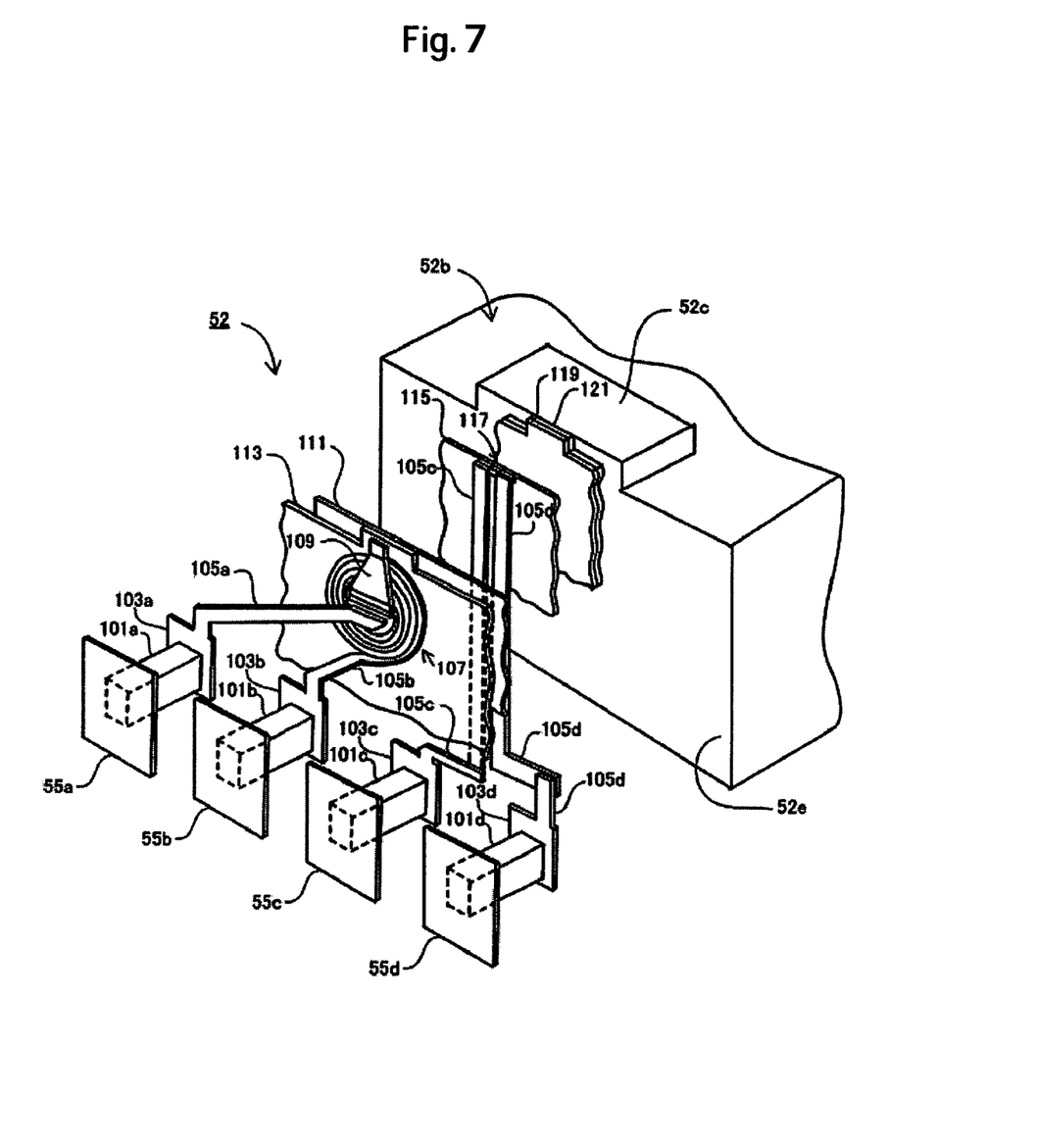
FIG. 7 is an exploded perspective view showing a principal portion of the head/slider.
Figure 8:
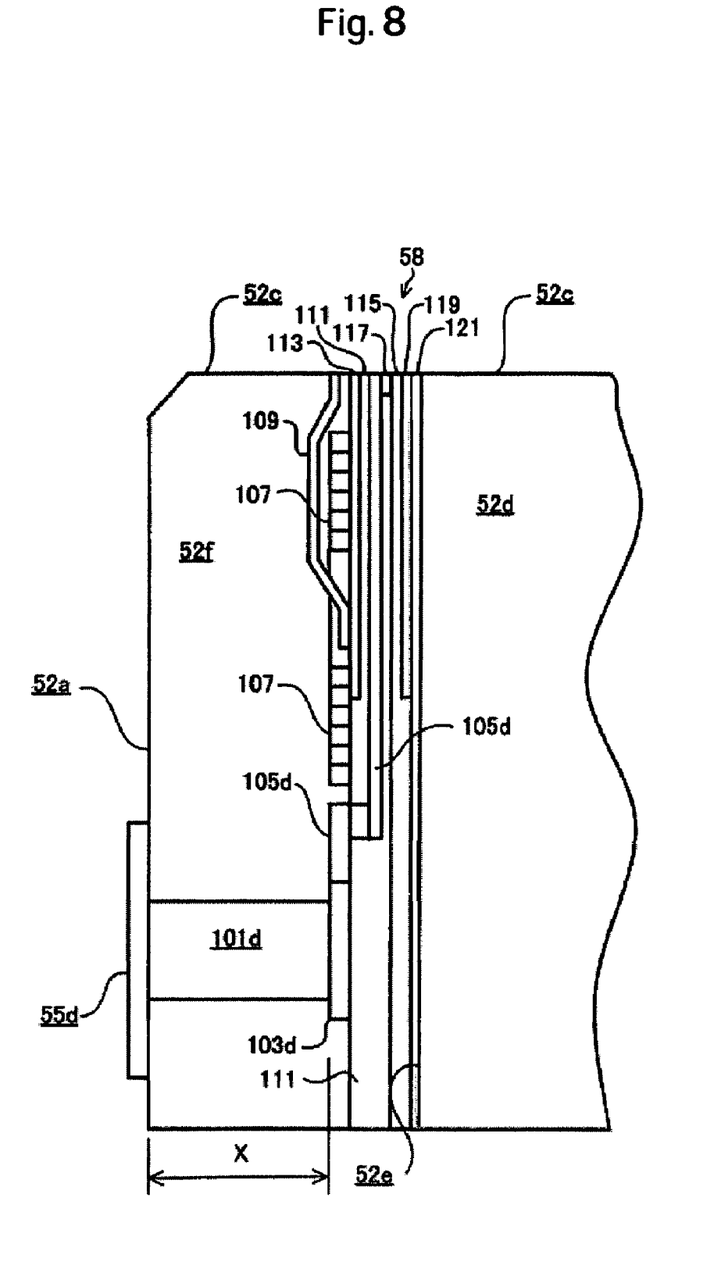
FIG. 8 is a sectional view of main constituent elements of the head/slider as cut along a plane passing through the constituent elements and as viewed sideways.

FIG. 7 is a perspective view for schematically explaining the structure of the slider pads of the head/slider 52 and the magnetic head portion. FIG. 8 is a sectional view of main constituent elements of the head/slider 52 as cut along a plane perpendicular to ABS 52b and a body end face 52e and as seen sideways. The profile of the head/slider 52 is formed by a body 52d of a rectangular parallelepiped shape, the body 52d being formed using, for example, a sintered material of Al, Ti and C called AlTic, and a protective film 52f laminated to the body end face 52e as one face of the body 52d.

The ABS 52b is a surface which undergoes a lifting force from an air flow in opposition to the surface of the magnetic disk when the head/slider 52 is installed within the magnetic disk drive 10. A center pad 52c and various other profile pattern shapes are formed by etching the AlTic. On the body end face 52e which is orthogonal to the ABS 52b, a read head and a write head both constituting a magnetic head 58 are formed using a thin film process at the portion corresponding to the center pad 52c and in the vicinity thereof.

The thin film magnetic head 58 formed on the head/slider 52 is constituted as a composite magnetic head. The composite magnetic head comprises a read head portion for reading magnetic information recorded on the magnetic disk 3 and a write head portion for writing magnetic information to the magnetic recording medium, the read head and the write head being integral with each other. For example, at a portion close to the ABS 52b in the region of the body 52d, the read head portion has a sequentially laminated structure of an insulating layer 121, a lower shield layer 119, a lower shield gap layer 115, an upper shield gap layer 111, and an upper shield layer 113. The upper shield layer 113 also functions as a lower magnetic pole of the write head portion. The upper shield layer 113 may be formed in a shape such that an upper shield layer is separated from the lower magnetic pole.

An MR element 117 comprising a giant magnetoresistive effect film (GMR film) and a magnetic domain control film is formed between the upper shield gap layer 111 and the lower shield gap layer 115. The MR element 117 is for reading information recorded on the magnetic disk 3 and it is disposed in face of the ABS 52b. The MR element 117 may also be constituted as a magnetoresistive effect element (MR film).

The magnetic domain control film, which is formed on both sides of the GMR film, is for applying a bias magnetic field in a constant direction to the GMR film. A pair of lead layers 105c and 105d are connected to the MR element 117. Like the MR element 117, the lead layers 105c and 105d are formed between the lower shield gap layer 115 and the upper shield gap layer 111. The lead layers 105c and 105d are formed of metal such as, for example, tantalum (Ta).

The lead layers 105c and 105d extend through the upper shield gap layer 111 and are connected to inner pads 103c and 103d formed on the upper shield gap layer 111. The write head portion comprises an upper magnetic pole 109, the upper shield layer 113 and a coil 107. The upper magnetic pole 109 and the upper shield layer 113 are magnetically coupled together at the central part of the coil 107 and their portions facing the ABS 52b form a write gap as a magnetic path. A magnetic flux created by an electric current flowing in the coil 107 which extends through the interior passes through the magnetic path. A lead layer 105a is connected to an end portion lying on the central side of the coil 107, while a lead layer 105b is connected to an outside end portion of the coil.

The lead layers 105a and 105b are connected respectively to inner pads 103a and 103b formed on the upper shield gap layer 111. The inner pads are copper layers formed by sputtering or CVD. Pillar-shaped electrode studs 101a, 101b, 101c, and 101d, each having a square section perpendicular to the current passing direction, are connected to the inner pads 103a, 103b, 103c, and 103d, respectively. The electrode studs, each having a length of X, are formed by a known method such as copper plating. The slider pads 55a, 55b, 55c, and 55d, are connected to the electrode studs 101a, 101b, 101c, and 101d, respectively.

The magnetic head 58 formed with the body end face 52e, the lead layers 105a, 105b, 105c, 105d, the inner pads 103a, 103b, 103c, 103d, and the electrode studs 101a, 101b, 101c, 101d, are covered with the protective film 52f of aluminum oxide. The slider pads 55a, 55b, 55c and 55d are formed on the trailing edge side face 52a as the surface of the protective film 52f. The electrode studs, the inner pads and the lead layers constitute electric current paths from the slider pads to the magnetic head. In the electric current paths, the portions connected directly to the slider pads are formed in a process separate from the process for forming the lead layers 105a, 105b, 105c and 105d. Thus, it is impossible to connect the lead layers directly to the slider pads 55a, 55b, 55c and 55d. The electrode studs 101a, 101b, 101c and 101d are provided for this reason.

The slider pads are connected to the lead pads by the solder ball connecting method. When a recording current is passed through the slider pads 55a and 55b in a write operation, a magnetic flux is created between the upper shield layer 113 as the lower magnetic pole and the upper magnetic pole 109 and a signal magnetic field for write is induced in the vicinity of a write gap. With this signal magnetic field, the magnetic disk is magnetized and information can be recorded thereby. On the other hand, in a read operation, a sense current is allowed to flow in the GMR film of the MR element 117 through the slider pads 55c and 55d. The resistance value of the GMR film varies depending on the signal magnetic field provided from the magnetic disk, so by detecting the change of the resistance value as voltage it is possible to read information recorded on the magnetic disk.

Figure 9:
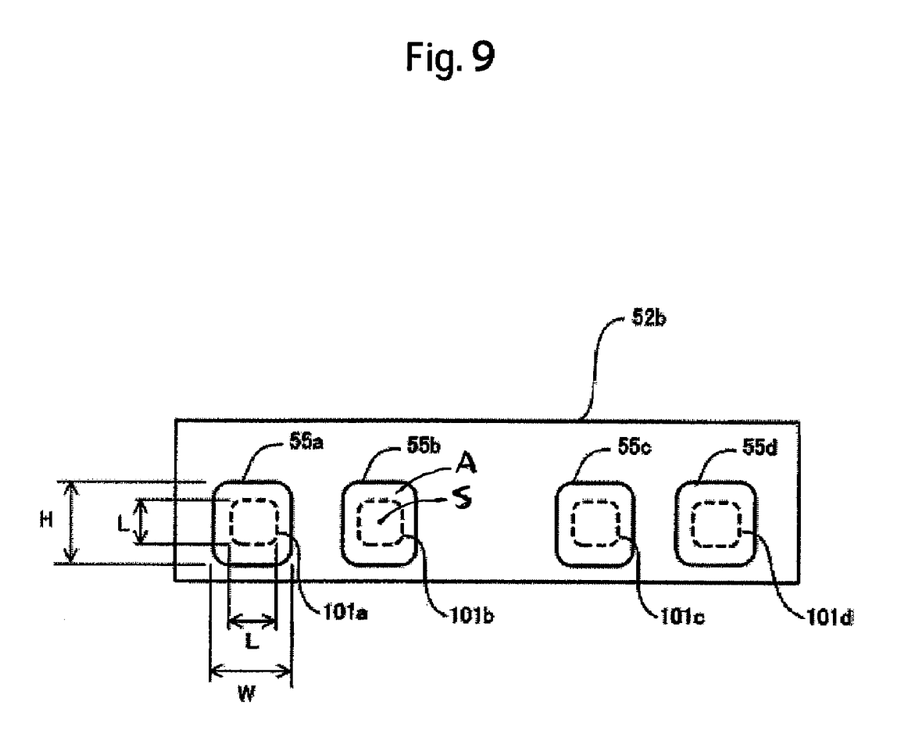
FIG. 9 is a diagram explaining the size of each slider pad and that of each electrode stud in the head/slider.

FIG. 9 illustrates a dimensional relation between the slider pads 55a, 55b, 55c, 55d and the electrode studs 101a, 101b, 101c, 101d. The soldering surface of each slider pad is formed in a rectangular shape having a width W of 138 µm and a height H of 145 µm and the area of the soldering surface is 20,100 µm². A section of each electrode stud perpendicular to the current flowing direction is formed in a square shape each side of which is L (µm). The sectional shape of each electrode stud may be selected in an arbitrary manner, for example, from among square, rectangular and circular shapes. In the present embodiment, the sectional area of each electrode stud is made smaller than that in the conventional like electrode stud, whereby a solder fillet of good quality can be formed even with weak laser energy.

Figure 11:
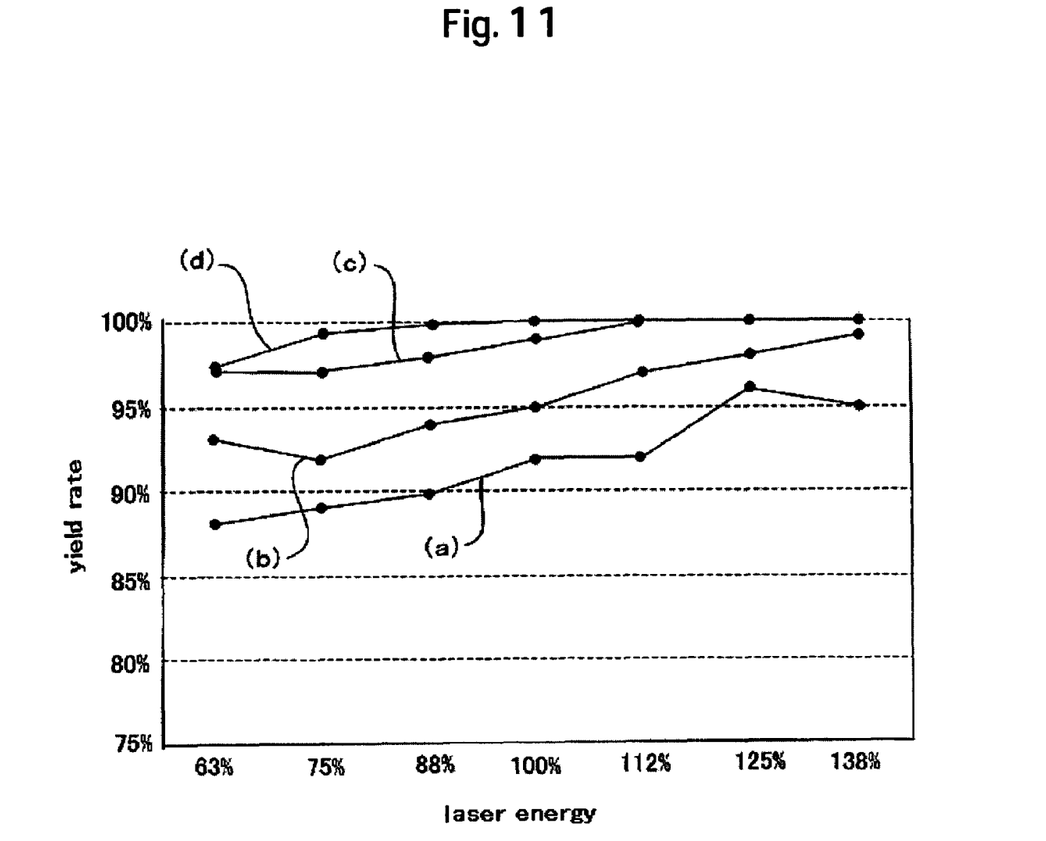
FIG. 11 is a diagram showing a non-defective solder fillet rate as measured for each of various sectional sizes of electrode studs relative to the solder ball diameter.

FIG. 11 is a graph showing a percent non-defective in solder connection obtained when slider pads and lead pads are soldered to each other by the solder ball connecting method under varying magnitudes of laser energy with respect to electrode studs having sectional areas of various sizes. The axis of abscissa in FIG. 11 represents the proportion of an actual laser energy magnitude relative to a laser energy magnitude established as a reference. The percent non-defective in solder connection plotted along the axis of ordinate was calculated by acceptance/unacceptance determination based on visual inspection of solder fillets after reflow performed for two hundred samples comprising slider pad/lead pad pairs. The determination of a connection defect is made when a solder fillet is not completely connected to the associated slider pad and lead pad or when solder fillets are short-circuited with each other or when the shape of a solder filler is not a normal shape.

The solder ball used in the experiment is formed using a lead-free solder and the diameter R thereof is 130 µm. In FIG. 11, the line (a) indicates the result obtained by applying the solder ball connecting method to a head/slider having electrode studs of a sectional area of such a size as heretofore been adopted. The value of L of each electrode stud is 90 µm. The percent non-defective in solder connection is only about 95% even with an increase of the laser energy magnitude to 138% and it decreases with a decrease of the laser energy magnitude. Heretofore, to form electrode studs safely, the value of L has been set to such a relative large value as 90 µm, which value has been maintained because there has been no need of making it smaller.

The line (b) in FIG. 11 indicates the result obtained by applying the solder ball connecting method to a head/slider having electrode studs of a sectional area of such a size as is adopted in the present embodiment. The value of L of each electrode stud is 75 µm. Throughout the whole of the laser energy magnitude used in the experiment the percent non-defective in solder connection is improved in comparison with the line (a) adopting the conventional electrode studs. The lines (c) and (d) each indicate the result obtained by applying the solder ball connecting method to a head/slider having electrode studs of a sectional area of such a size as is adopted in the present embodiment. The line (c) is of the case where L of each electrode stud is 57 µm and the line (d) is of the case where L of each electrode stud is 30 µm.

It is seen from FIG. 11 that when the same laser energy is radiated to solder balls of the same diameter in accordance with the solder ball connecting method, the smaller the sectional area of each electrode stud, the higher the percent non-defective in solder connection. As shown in line (d), when L of each electrode stud is set at 30 µm, the percent non-defective in solder connection can be made 100% even if the laser energy is lowered to 88%. In connection with the solder ball connecting method, an attempt to make the sectional area of an electrode stud small to thereby improve the percent non-defective in solder connection has not been made yet and thus it is a novel finding in the present invention. This is presumed to be because of an excessive fear of a possible lowering in the reliability of connection with slider pads and inner pads in case of making small the sectional area of each electrode stud, with consequent failure to reach the idea in question. In the present invention, however, it has been confirmed that there arises no problem even if the value of L of each electrode stud is made as small as 30 µm, provided the value of 30 µm is not the lower limit of L.

The relation between the size of a sectional area of each electrode stud and the percent non-defective in solder connection, which is shown in FIG. 11, is analyzed as follows. The reason why the percent non-defective in solder connection lowers with a lowering of laser energy is that heat is absorbed by each electrode stud with consequent drop of temperature before the solder ball melted by the radiation of a laser beam spreads sufficiently over the connecting surfaces of both slider pad and lead pad in accordance with the wettability of solder. Therefore, if it is assumed that the quantity of heat absorbed by each electrode stud is the same, the smaller the diameter R of a solder ball, the more marked the lowering in temperature of melted solder ball and the lower the percent non-defective in solder connection.

The larger the sectional area of an electrode stud, the larger the quantity of heat which the electrode stud absorbs in a definite period of time. Therefore it is possible to specify such a head/slider structure as permits improvement of the percent non-defective in solder connection with the relation between the solder ball diameter R (m) and the electrode stud sectional area S (m²) as a parameter. In the present embodiment, the solder ball diameter R and the electrode stud sectional area S are selected so as to satisfy the relation of $R^2 \geq 4S$, whereby it is possible to effect such a solder connection as affords a high percent non-defective in solder connection. This indicates that when the solder ball diameter is set at 130 µm, the electrode stud sectional area S becomes 4,225 μm² and one side L of a square becomes 65 μm, thus the electrode stud sectional area becomes smaller than the sectional area of the electrode stud having one side L of 90 μm adopted in the conventional head/slider.

In order to effect solder connection at a percent non-defective products corresponding to the line (d) in FIG. 11, since the solder ball diameter is 130 μm and the electrode stud sectional area is 900 μm², it is preferable to define the size of a solder ball and the sectional area of an electrode stud so as to satisfy the relation of $R^2 \geq 19S$. A suitable lower limit of the sectional area S may be selected so as to make it possible to ensure required current conduction capacity and connection reliability. To attain the effect of the present embodiment it is preferable that the sectional area S be as small as possible. Although the relations of $R^2 \geq 4S$ and $R^2 \geq 19S$ are here derived from specific working examples, they can also be applied to other solder ball-electrode stud combinations on the basis of the principle of the present invention.

The solder ball diameter R determines the quantity of solder for forming a solder fillet. The size of a solder fillet is influenced by the sizes of corresponding slider pad and lead pad and the spacing between both pads. In the solder ball connecting method, the solder ball diameter R is selected so as to be almost equal to or a little smaller than one side of a square slider pad. In view of this embodiment, the parameter including the solder ball diameter R and the electrode stud sectional area S can be replaced by a relation between the soldering surface area A (m²) of a slider pad and the sectional area S (m²) of an electrode pad.

In this case, since $R^2$ corresponds to the soldering surface area A of the slider pad, $R^2 \geq 4S$ can be replaced by $A \geq 4S$ and $R^2 \geq 19S$ can be replaced by $A \geq 19S$. Although the relations of $A \geq 4S$ and $A \geq 19S$ are derived from specific working examples, they can also be applied to other slider pad-electrode stud combinations on the basis of the principle of the present invention and the general relation between the solder ball diameter and the slider pad size adopted in the solder ball connecting method.

When the electrode stud sectional area S is defined relative to the solder ball diameter R or the soldering surface area A of a slider pad, it becomes possible to use weaker laser energy for the fabrication of HGA having been subjected to the soldering process at a higher percent non-defective in solder connection. Weakening the laser energy to a certain value is advantageous in that, in the fabrication of HGA, not only actualized damage of magnetic head elements and dielectric material caused by laser energy can be diminished, but also latent damage incapable of being found out in the fabrication stage can be diminished. Further, assuming that the magnitude of laser energy is constant, it is possible to fabricate HGA at a higher percent non-defective in solder connection.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A head gimbal assembly comprising:
a suspension assembly including a lead wire formed with a lead pad, a flexure and a load beam; and
a head/slider attached to said flexure and including a slider pad connected to said lead pad through a solder fillet formed on a solder ball by emission of a laser beam, said head/slider further including:
a magnetic head; and
an electric current path connected to both said magnetic head and said slider pad, the electric current path including a pillar-shaped electrode stud connected to said slider pad;
wherein a diameter R (m) of said solder ball and a sectional area S (m²) of said electrode stud are in the relation of $R^2 \geq 4S$.

2. A magnetic disk drive comprising:
a magnetic disk;
a head gimbal assembly including a head/slider and a suspension assembly with said head/slider mounted thereon, said head/slider having a magnetic head adapted to access said magnetic disk; and
an actuator assembly with said head gimbal assembly attached thereto;
wherein said head gimbal assembly is the head gimbal assembly recited in claim 1.

3. A head gimbal assembly according to claim 1, wherein the diameter R (m) of said solder ball and the sectional area S (m²) of said electrode stud are in the relation of $R^2 \geq 19S$.

4. A head gimbal assembly according to claim 1, wherein the section of said electrode stud is formed in a substantially square, rectangular or circular shape.

5. A head gimbal assembly according to claim 1, wherein said electric current path has an internal pad for connection between a lead layer connected to said magnetic head and said electrode stud.

6. A head gimbal assembly according to claim 1, wherein said electrode stud is formed within a protective film of aluminum oxide.

7. A head gimbal assembly according to claim 1, wherein said electrode stud is formed of copper.

8. A head gimbal assembly according to claim 1, wherein the diameter R of said solder ball is about 130 μm or less.

9. A head gimbal assembly according to claim 1, wherein said solder ball is formed of lead-free solder.

10. A head gimbal assembly according to claim 1, wherein:
said magnetic head includes a read head and an inductive write head;
said head/slider includes four electric current paths connected to said write head and said read head, and four slider pads connected to said four electric current paths respectively; and
the sectional area S (m²) of the connection between each of said four electric current paths and each of said slider pads and the diameter R (m) of said solder ball are in the relation of $R^2 \geq 4S$.

11. A head gimbal assembly comprising:
a suspension assembly including a lead wire formed with a lead pad, a flexure and a load beam; and
a head/slider attached to said flexure and including a slider pad connected to said lead pad through a solder fillet formed on a solder ball by emission of a laser beam, said head/slider further including:
a magnetic head; and
an electric current path connected to both said magnetic head and said slider pad, the electric current path including a pillar-shaped electrode stud connected to said slider pad;
wherein an area A (m²) of a soldered surface of the slider pad and a sectional area S (m²) of said electrode stud are in the relation of $A \geq 4S$.

12. A head gimbal assembly according to claim 11, wherein said solder ball is formed of lead-free solder.

13. A head gimbal assembly according to claim 11, wherein the area A (m$^2$) of the soldered surface of said slider pad and the sectional area S (m$^2$) of said electrode stud are in the relation of A≧19S.

14. A head gimbal assembly according to claim 11, wherein the section of said electrode stud is formed in a substantially square, rectangular or circular shape.

15. A head gimbal assembly according to claim 11, wherein said electric current path has an internal pad for connection between a lead layer connected to said magnetic head and said electrode stud.

16. A head gimbal assembly according to claim 11, wherein said electrode stud is formed within a protective film of aluminum oxide.

17. A head gimbal assembly according to claim 11, wherein said electrode stud is formed of copper.

18. A head gimbal assembly according to claim 11, wherein the diameter R of said solder ball is in the range of about 80 to 130 μm.

* * * * *